US008530756B1

(12) United States Patent
Winch

(10) Patent No.: US 8,530,756 B1
(45) Date of Patent: Sep. 10, 2013

(54) ELECTROMAGNETICALLY SHIELDED ENCLOSURE AND ENTRY SEAL

(76) Inventor: Gary William Winch, Naples, NY (US)

( * ) Notice: Subject to any disclaimer, the term of this patent is extended or adjusted under 35 U.S.C. 154(b) by 546 days.

(21) Appl. No.: 12/762,519

(22) Filed: Apr. 19, 2010

Related U.S. Application Data

(60) Provisional application No. 61/171,133, filed on Apr. 21, 2009.

(51) Int. Cl.
*H05K 9/00* (2006.01)

(52) U.S. Cl.
USPC .......................................... 174/382; 52/79.1

(58) Field of Classification Search
USPC .................. 174/377, 382; 361/816; 52/79.1
See application file for complete search history.

(56) References Cited

U.S. PATENT DOCUMENTS

| | | | | |
|---|---|---|---|---|
| 3,623,436 A | * | 11/1971 | Barrow, Jr ....................... | 109/77 |
| 3,969,572 A | * | 7/1976 | Rostek .......................... | 174/353 |
| 4,785,136 A | * | 11/1988 | Mollet et al. .................. | 174/363 |
| 5,545,844 A | * | 8/1996 | Plummer et al. ............... | 174/379 |
| 5,908,043 A | | 6/1999 | Paes et al. | |
| 6,011,504 A | | 1/2000 | Tan | |
| 6,068,009 A | | 5/2000 | Paes et al. | |
| 6,111,192 A | * | 8/2000 | Bell et al. ....................... | 174/384 |
| 6,140,576 A | * | 10/2000 | Kanne et al. ................... | 174/378 |
| 6,170,203 B1 | * | 1/2001 | Schlapfer ...................... | 52/173.1 |
| 2002/0078989 A1 | * | 6/2002 | Zheng ............................ | 135/125 |
| 2002/0121386 A1 | * | 9/2002 | Traut et al. .................... | 174/350 |
| 2004/0250483 A1 | * | 12/2004 | Zheng ............................ | 52/79.5 |
| 2005/0061526 A1 | * | 3/2005 | Hensley et al. ........... | 174/35 GC |
| 2010/0043855 A1 | * | 2/2010 | Rothweil ....................... | 135/135 |

* cited by examiner

*Primary Examiner* — Hung Ngo
(74) *Attorney, Agent, or Firm* — Patent Technologies, LLC; Robert D. Gunderman, Jr.

(57) ABSTRACT

An electromagnetically shielded enclosure that is portable and lightweight that can be used for applications such as testing and security. The electromagnetically shielded enclosure has a novel entry seal that eliminates the electromagnetic leakage that is common around the entry areas of such enclosures. The entry seal has an outer door with a perimeter magnetic material, an outer door magnetic closure that aligns with the outer door perimeter magnetic material, an inner door with a perimeter magnetic material, and an inner door magnetic closure that aligns with the inner door perimeter magnetic material.

15 Claims, 7 Drawing Sheets

ELECTROMAGNETICALLY SHIELDED ENCLOSURE AND ENTRY SEAL

CROSS REFERENCE TO RELATED PATENT APPLICATIONS

This application claims priority to U.S. Patent Application Ser. No. 61/171,133 filed Apr. 21, 2009 entitled "Electromagnetically Shielded Enclosure And Entry Seal" by Gary W. Winch of Naples, N.Y.

BACKGROUND OF THE INVENTION

1. Field of the Invention

This invention relates generally to electromagnetic shielding, and more specifically to an electromagnetically shielded enclosure having a novel entry seal.

2. Description of Related Art

As the proliferation of radiofrequency generating devices continues at a rapid pace, there is an ongoing and growing need to shield from unwanted electromagnetic radiation for various purposes. For example, certain electronic equipment requires an electromagnetically "quiet" environment to function properly. Such equipment includes, for example, some medical diagnostic and imaging equipment. In addition, testing of electronic equipment often requires a similar electromagnetically "quiet" environment.

In some situations, there is also the need to prevent radiofrequencies from leaving a confined physical area. Such situations include, for example, the use of computer and military electronics where there is the risk of unwanted detection of a radiated radiofrequency signal or unwanted detection of the associated harmonics and signature of radiofrequency activity.

Further, testing such as EMI/EMC testing requires the monitoring of electromagnetic energy released from a device under test in a controlled environment where there are little or no outside sources of electromagnetic radiation that could interfere with the monitoring of the device under test. Such testing may also include subjecting a device under test to external electromagnetic energy and monitoring the impact of this external electromagnetic energy on the proper functioning of the device under test.

With the various requirements for electromagnetically shielded enclosures, there exists a need to make these enclosures portable, lightweight, rapidly deployable, temporary, and relatively low cost. With the advent of metallized fabrics and textiles, shielded tents and portable enclosures are available today. These enclosures are essentially a Faraday Cage where electromagnetic signals should not pass. Such enclosures come in many shapes and sizes, and are available from various manufacturers. While such enclosures are available, their shielding effectiveness may not always be adequate due to radiofrequency leakage at to seams and ingress/egress points such as doors. As such, the overall construction of a portable electromagnetically shielded enclosure is a vital part of the performance of the shielded enclosure.

The shielding effectiveness of a portable electromagnetic enclosure is controlled by several variables, including the type of metallized fabric used and the overall construct of the portable electromagnetic enclosure. Stitching, fasteners, ventilation, and ingress/egress panels all must be properly designed to limit the amount of electromagnetic leakage. Most portable electromagnetic enclosures have an ingress/egress section such as a door or removable panel. Such doors and panels are prone to electromagnetic leakage, particularly where the door or panel meets the side of the electromagnetic enclosure.

It is thus an object of the present invention to provide an electromagnetic enclosure that is portable, lightweight, rapidly deployable, temporary, and relatively low cost. It is another object of the present invention to provide an electromagnetic enclosure with an entry seal that is not prone to electromagnetic leakage. It is another object of the present invention to provide an electromagnetic enclosure that is portable and easily adjustable.

BRIEF SUMMARY OF THE INVENTION

In accordance with the present invention, there is provided an electromagnetically shielded enclosure having an entry seal where the entry seal comprises an outer door having a perimeter magnetic material, an outer door magnetic closure that aligns with the outer door perimeter magnetic material, an inner door having a perimeter magnetic material, and an inner door magnetic closure that aligns with the inner door perimeter magnetic material.

The foregoing paragraph has been provided by way of introduction, and is not intended to limit the scope of the invention as described in this specification, claims and the to attached drawings.

BRIEF DESCRIPTION OF THE DRAWINGS

The invention will be described by reference to the following drawings, in which like numerals refer to like elements, and in which.

Figure 1:
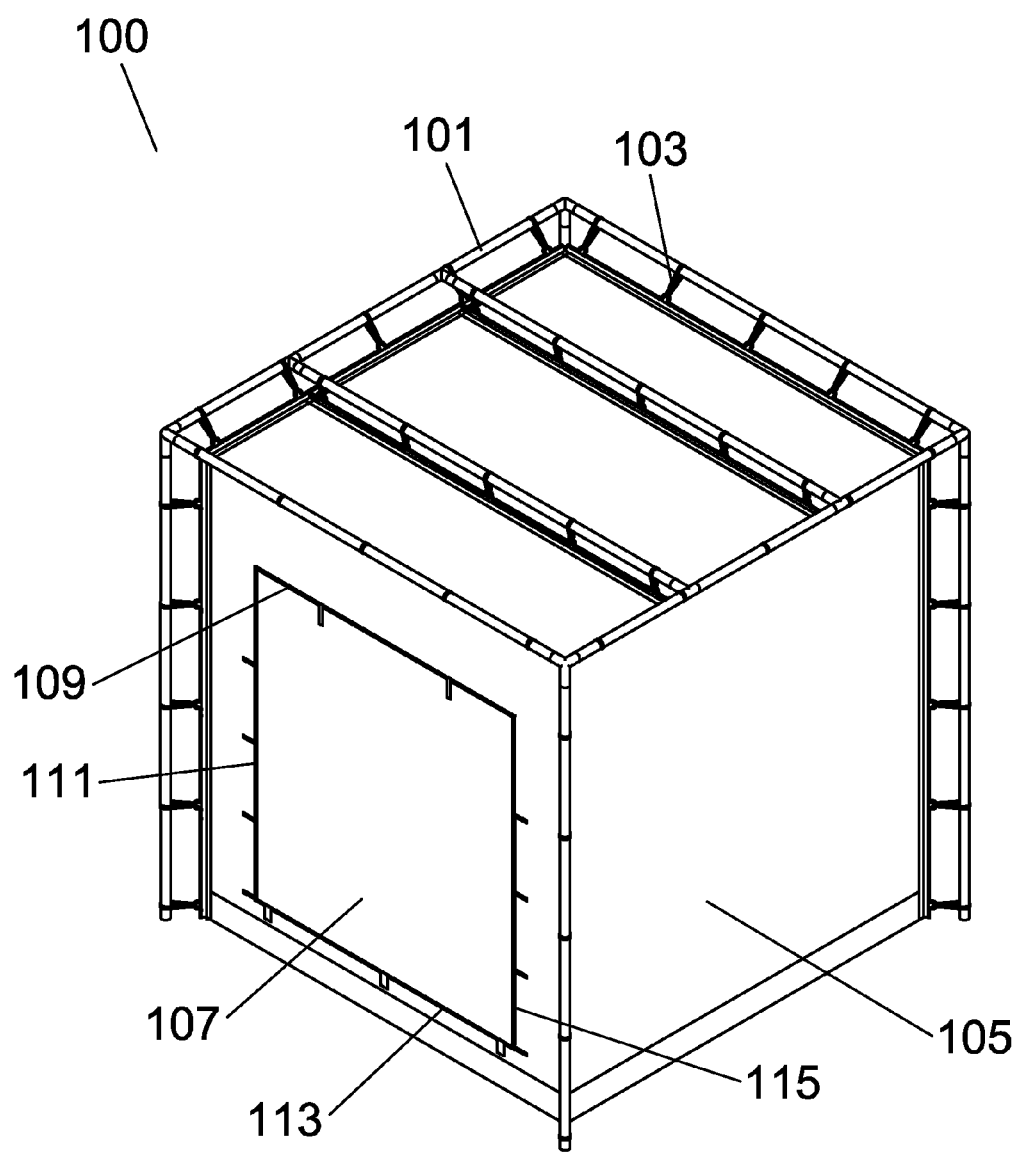
FIG. 1 is a perspective view of an electromagnetically shielded enclosure and entry seal.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, claims and the attached drawings.

DESCRIPTION OF THE PREFERRED EMBODIMENTS

There are various techniques for the design and construction of an electromagnetically shielded enclosure. The shape, size and materials selected for an electromagnetically shielded enclosure may vary based on the intended application. The present invention and the various embodiments depicted and envisioned herein do not rely on specific geometries, materials, or structural designs, but rather, the entry seal of the present invention may be adapted and modified to fit a wide range of electromagnetically shielded enclosures. Such adaptations and modifications will become evident to one skilled in the art after reading this specification and viewing the attached drawings.

For a general understanding of the present invention, reference is made to the drawings. In the drawings, like reference numerals have been used throughout to designate identical elements.

FIG. 1 is a perspective view of an electromagnetically shielded enclosure 100 and entry seal. The electromagnetically shielded enclosure depicted in FIG. 1 uses a frame 101 for support; such external frames are readily available in various configurations by various manufacturers. An example of a manufacturer of frames is Rose and Krieger of Frederick, Md. Frames may be made from aluminum, fiberglass, or other suitable structurally sufficient material. Various manufacturers and frame designs may be used without departing from the spirit and scope of the present invention and its various embodiments depicted, described, illustrated or envisioned herein. The entry seal of the present invention may also be used with an electromagnetically shielded enclosure that is frameless, or uses an internal frame, an inflatable structure, or the like.

The entry seal of the present invention includes an inner door and an outer door and a novel magnetic sealing arrangement that provides for electromagnetic shielding and reduces the electromagnetic "leaks" common in the door and entry areas of many electromagnetically shielded enclosures. The present invention includes magnetic sealing arrangements as well as sealing arrangements that use a closure material that may include magnetic strips, conductive hook and loop fasteners, flaps made of fabric or other material, weights, conductive foam, conductive zippers, radiofrequency absorption material, and the like. The manufacture and use of the entry seal of the present invention and its various embodiments will become evident upon further review of this specification and drawings.

The overall electromagnetically shielded enclosure 100, as depicted in FIG. 1, is supported by the frame 101 by way of retaining straps 103, bungee cords, quick release buckles and fasteners, or similar retention devices. These retention devices are commonly made from nylon, polyester, and the like and may include additional hardware. The electromagnetically shielded enclosure 100 has sides 105, as well as top and bottom, that are made from a conductive material such as, for example, a metallized woven textile, a mesh, a metal, and the like. Other materials may also be included in the electromagnetically shielded enclosure. In addition, the materials may be layered or compositely structured to accomplish additional shielding effectiveness, weather resistance, structural integrity, and the like. An example of such a metallized woven textile is a silver plated woven nylon ripstop fabric sold under the tradename ProTex Ag by Carolina Silver Technologies of Maiden, N.C. In some embodiments of the present invention, the fabric may be fire retardant or be treated with a fire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention. The electromagnetically shielded enclosure 100 has a door assembly that reduces or eliminates electromagnetic leakage around the entry area. Shown in FIG. 1 is an outer door 107 that is made from a conductive material such as a metallized woven textile, and may, in some embodiments of the present invention, be the same material used for the sides of the enclosure 100. The top of the outer door 109 is attached to the enclosure 100, and may, in some embodiments of the present invention, be detachable. The outer door left side 111 and the outer door right side 115, as well as the outer door bottom 113 are to constructed with closure material such as magnets, as will be further explained by way of FIGS. 5 and 6. The outer door 107 is depicted with a threshold below it to facilitate proper electromagnetic sealing. The height of the threshold may vary. The threshold may further be removable or detachable to allow for ease of passage through the entryway. The electromagnetically shielded enclosure 100 may also have an outer protective covering; the protective covering, for example, may cover the bottom of the enclosure, and may be made from, for example, reinforced vinyl. Other parts of the electromagnetically shielded enclosure may also have an outer protective covering for various purposes, such as, for example, increased water resistance, ultraviolet protection, and the like.

Figure 2:
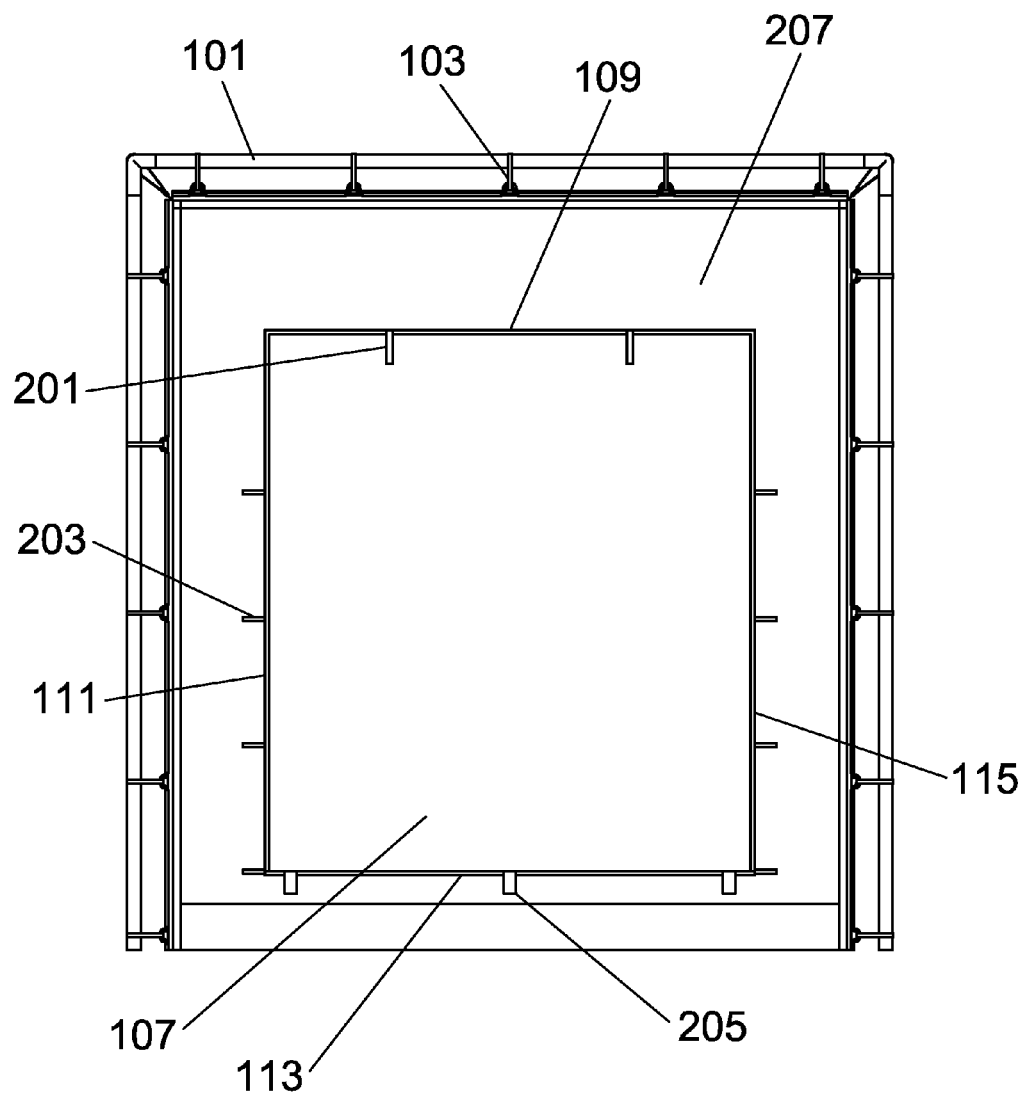
FIG. 2 is a plan view of an electromagnetically shielded enclosure showing the entry seal in a closed position with the outer door visible.

Now turning to FIG. 2, a plan view of an electromagnetically shielded enclosure can be seen that shows the entry seal in a closed position with the outer door visible. The entry side 207 of the enclosure has fittings to accommodate the entry seal. The three sides of the outer door 107 (the bottom and two sides) contain fasteners such as specially designed magnets that mate with magnets on the perimeter of the entry opening of the enclosure to provide an electromagnetic seal. To assist in aligning the outer door 107 in the entry opening, outer door alignment loops 203 are fastened to the perimeter of the outer door 107. The alignment loops 203 may be made from a fabric such as the fabric used to make the enclosure, or may be made from a plastic, textile, or the like. There may be a plurality of such alignment loops 203 placed along the perimeter of the outer door 107. When the outer door 107 is open, there may be times when it is desirable to roll the outer door up and towards the top of the entry opening, and retain the outer door in an open position. To facilitate keeping the outer door open, one or more outer door retaining surfaces 201 are fastened toward the top of the entry opening. The outer door retaining surfaces 201 are used to encompass the rolled up outer door and mate with an outer door retaining strap 209 (see FIG. 3), thus keeping the outer door in position and out of the way. The outer door retaining surfaces 201 may be made from any appropriate fastening material, such as hook and loop fasteners, straps and buckles, and the like. Also shown in FIG. 2 is an outer door weight 205 that may be made from steel, brass, lead, copper, stone, ceramic, or the like. In addition to, or in the place of, the discrete outer door weights 205, a continuous weight strip may be employed. The purpose of the weights is to ensure that the magnetic faces of the door properly align with the magnetic faces of the entry opening.

The entry opening has two doors, each of which have similar construction. The inner door is slightly smaller than the outer door. In some embodiments, however, the outer door may be slightly smaller than the inner door. In some embodiments, the placement and location of the inner door and the outer door may be rotated with respect to each other. The two doors provide electromagnetic sealing. In some embodiments of the present invention, only a single door may be used; however, often times a two door arrangement provides for improved electromagnetic sealing and may be a preferred embodiment. Additional doors may be added to provide for additional electromagnetic sealing or for weatherproofing or the like. The doors roll out of the way, and may roll either inward or outward, as well as from the top edge or the bottom edge, or be a combination thereof. Such an arrangement eliminates the need for a hinge type arrangement and provides for a simple, clean and highly reliable and easy to use setup.

Figure 3:
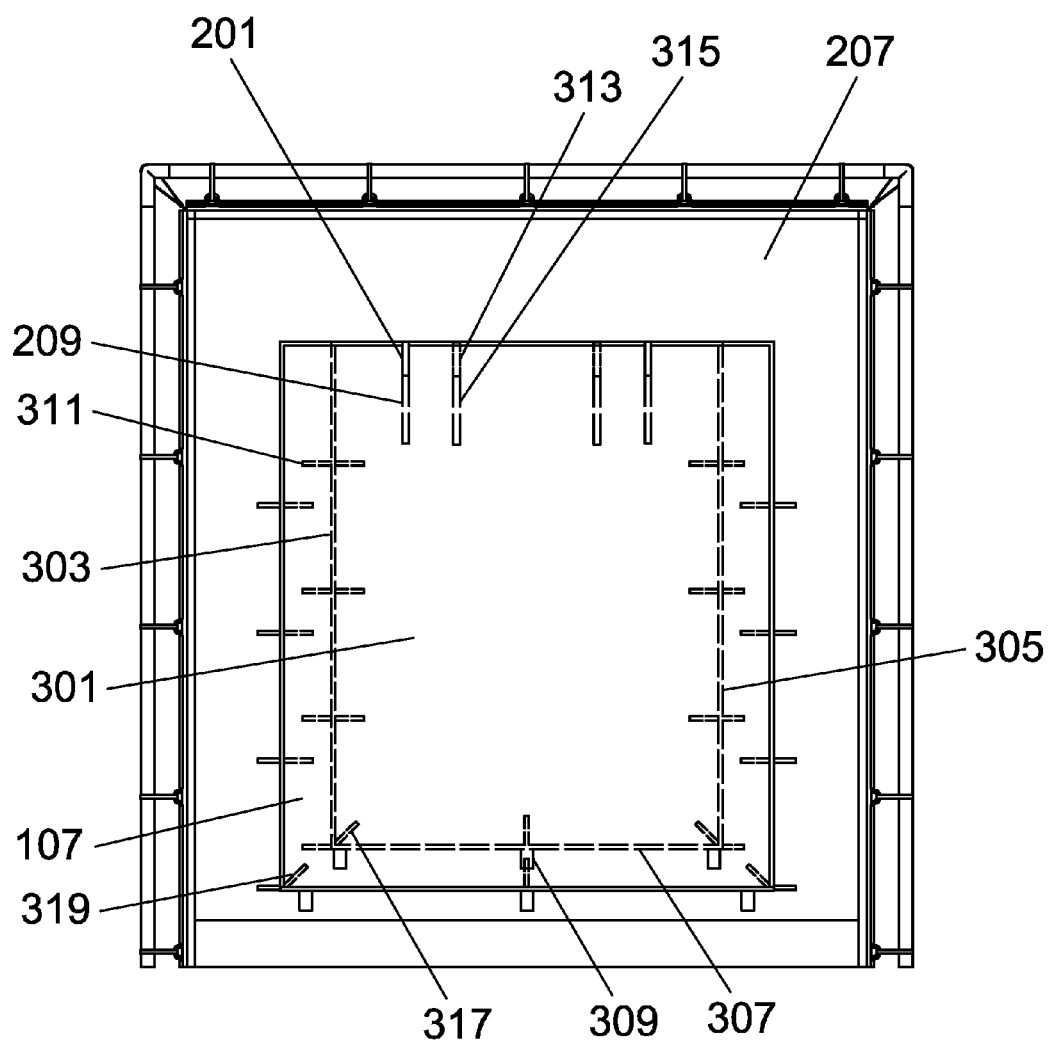
FIG. 3 is a plan view of an electromagnetically shielded enclosure showing the to outer door in a closed position and the inner door in dotted outline.

FIG. 3 shows a plan view of an electromagnetically shielded enclosure showing the outer door in a closed position and the inner door in dotted outline. The inner door 301 is attached to the entry perimeter at the top. The inner door left side 303, inner door right side 305, and inner door bottom 307 each contain magnets that mate with an inner door magnetic closure that has magnets fastened to the perimeter of an inner entry perimeter surface (not seen in FIG. 3, see FIG. 4). Magnets used in the construction of the entry seal are preferably long strips of magnetic material that can be easily sewn, encased in fabric or other material, or otherwise fastened, to the perimeter of each entry and door. An example of such a magnet is the Reance SF™ Neodymium Iron Boron magnet manufactured by The Electrodyne Company of Batavia, Ohio, and further disclosed in U.S. Pat. No. 6,707,361, the entire disclosure of which is incorporated herein by reference. Magnets may also be reinforced with material such as, for example, an adhesive foam or fabric, to increase their durability. Similar to the outer door construction, the inner door 301 has an inner door weight 309 that may be made from steel, brass, lead, copper, stone, ceramic, or the like. In addition to, or in the place of, the discrete inner door weights 309, a continuous weight strip may be employed. The purpose of the weights is to help ensure that the magnetic faces of the door properly align with the magnetic faces of the opening. To assist in aligning the inner door 301 in the opening, inner door outer alignment loops 311 and inner door inner alignment loops 317 are fastened to the perimeter of the inner door 301. The outer door further may have, in some embodiments of the present invention, alignment loops 319. The alignment loops may be made from a fabric such as the fabric used to make the enclosure, or may be made from a plastic, textile, or the like. Alignment loops may also contain a stiffener to facilitate their use. There may be a plurality of such alignment loops placed along the perimeter of the inner door 301. When the inner door 301 is open, there may be times when it is desirable to roll the inner door up and towards the top of the entry opening, and retain the inner door in an open position. To facilitate keeping the inner door open, one or more inner door retaining surfaces 313 are fastened toward the top of the entry opening. The inner door retaining surfaces 313 are used to encompass the rolled up inner door and mate with an inner door retaining strap 315, thus keeping the inner door in position and out of the way. The inner door retaining surfaces 313 may be made from any appropriate fastening material, such as hook and loop fasteners, strap and buckles, and the like. In addition, the inner door may roll inward or outward, and the outer door may roll inward or outward, such that various combinations of inward and outward rolling inner and outer doors may be achieved.

Figure 4:
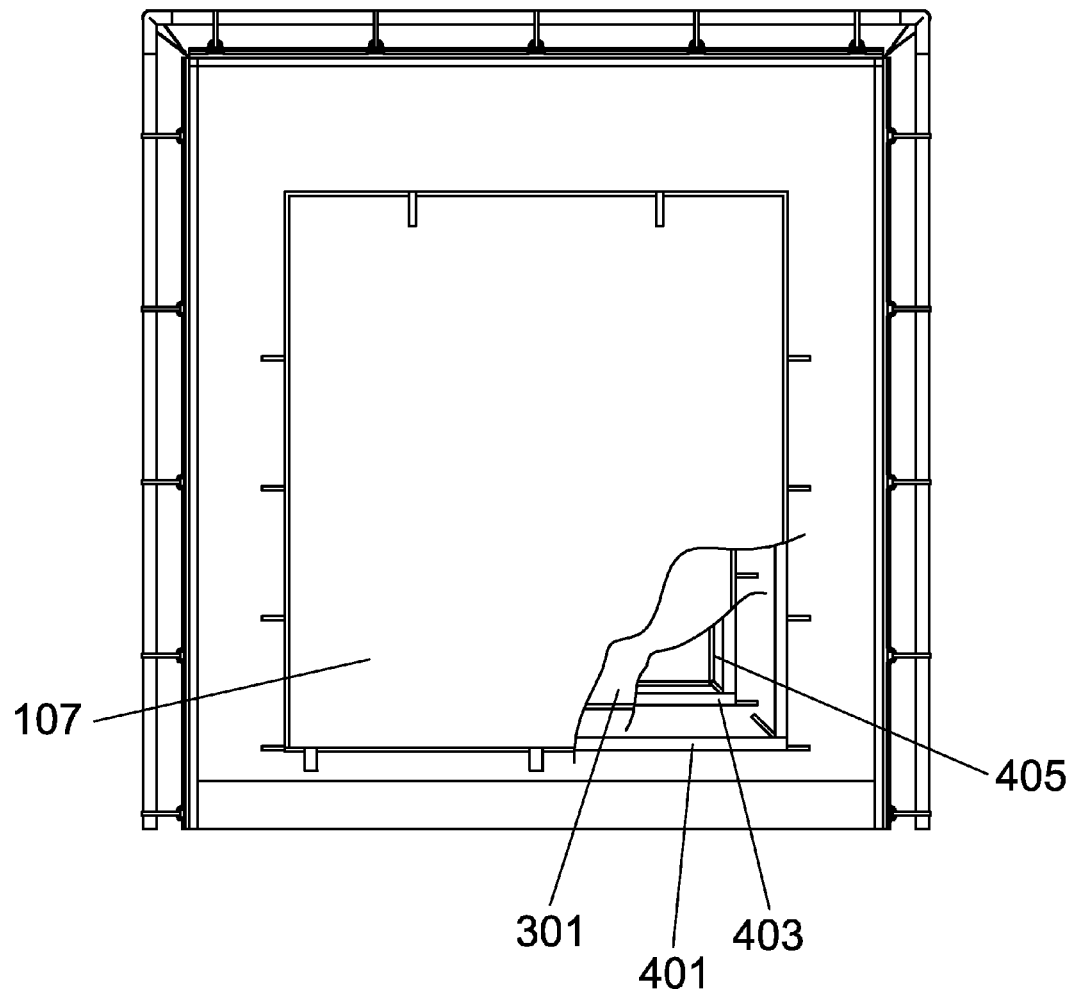
FIG. 4 is a plan view of an electromagnetically shielded enclosure showing the entry seal with both inner door and outer door partially cut away.

To further understand the entry seal of the present invention, FIG. 4 depicts a plan view of an electromagnetically shielded enclosure showing the entry seal with both inner door and outer door partially cut away. The outer door 107 can be seen cutaway, revealing the inner door 301 and the inner door magnetic closure 403 and the outer door magnetic closure 401. The outer door 107, as previously described, contains magnetic material on the perimeter of the door. The strips of magnetic material are sewn into the edge of the outer door or otherwise fastened or encased thereupon. The magnetic perimeter of the outer door 107, in use mates with strips of magnetic material attached to the perimeter of the outer door magnetic closure 401, thus forming an electromagnetically tight seal. In one embodiment of the present invention, the strips of magnetic material used in the outer door magnetic closure 401 are wider than the strips of magnetic material used in the outer door 107. Various width magnetic strips may be used as well without departing from the spirit and scope of the present invention. This facilitates proper alignment. In a similar manner, the inner door 301 can be seen partially cut away and behind the outer door 107. The inner door 301, as previously described, contains magnetic material on the perimeter of the door. The strips of magnetic material are sewn into the edge of the inner door or otherwise fastened or encased thereupon. The magnetic perimeter of the inner door 301, in use mates with strips of magnetic material attached to the perimeter of the inner door magnetic closure 403, thus forming an electromagnetically tight seal. In one embodiment of the present invention, the strips of magnetic material used in the inner door magnetic closure 403 are wider than the strips of magnetic material used in the inner door 301. Various width magnetic strips may be used as well without departing from the spirit and scope of the present invention. This facilitates proper alignment. FIG. 4 also shows the tent wall with bias 405. The bias and the construction of the entry seal is further described by way of FIGS. 5 and 6. The bias ensures that the edge of the metallized fabric is not exposed in a way that would allow it to unravel or otherwise deteriorate with use.

Figure 5:
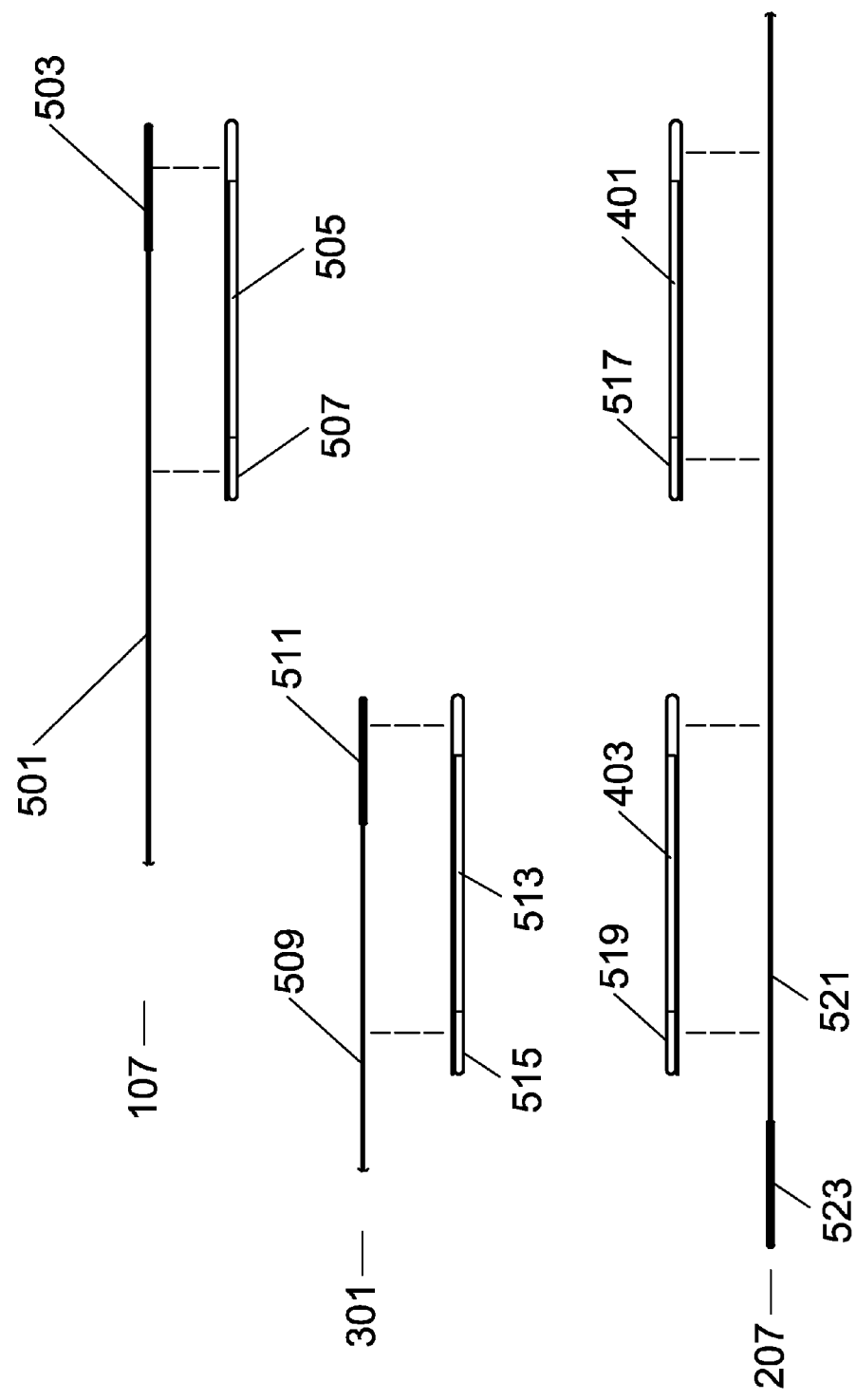
FIG. 5 is an exploded view of a vertical side of the outer and inner door and seal.

Turning now to FIG. 5, an exploded view of a vertical side of the outer and inner door and seal is depicted. Modifications and variations on the basic construction may be made, and are within the scope of the present invention and its various embodiments. For clarity, stitching or other fastening techniques and materials are not shown in the drawings, but the placement of such fasteners or stitches will be clear to one skilled in the art after reviewing this specification with the attached drawings. At the bottom of FIG. 5 is the entry side 207 of the enclosure. The entry side 207 is made of metallized fabric 521, as previously described, and incorporates a bias 523 that is a properly folded piece of fabric that is stitched or otherwise fastened in place and covers all exposed cut edges, thus preventing fraying or other unraveling or deconstruction of the material. Two magnetic closures 401 and 403 are attached to the entry side 207 by way of fabric 517 and 519 respectively, and are placed around the perimeter of the entry to the enclosure in such a way that the mating magnetic surface of the inner and outer doors align with, and adhere to, the magnetic closures 401 and 403. The inner door 301 depicted in cross section above the exploded entry side detail 207 shows the inner door fabric 509 with a bias 511, and attached thereupon is a magnetic strip 513 encased in fabric 515. The magnetic strip 513 of the inner door is circumlocated on the perimeter of the inner door. In a similar manner, the outer door 107 is depicted in cross section at the top of FIG. 5, and shows the outer door fabric 501 with a bias 503, and attached thereupon is a magnetic strip 505 encased in fabric 507. The elements depicted in FIG. 5 thus show an exemplary embodiment of the construction of the vertical edges of the entry seal.

Figure 6:
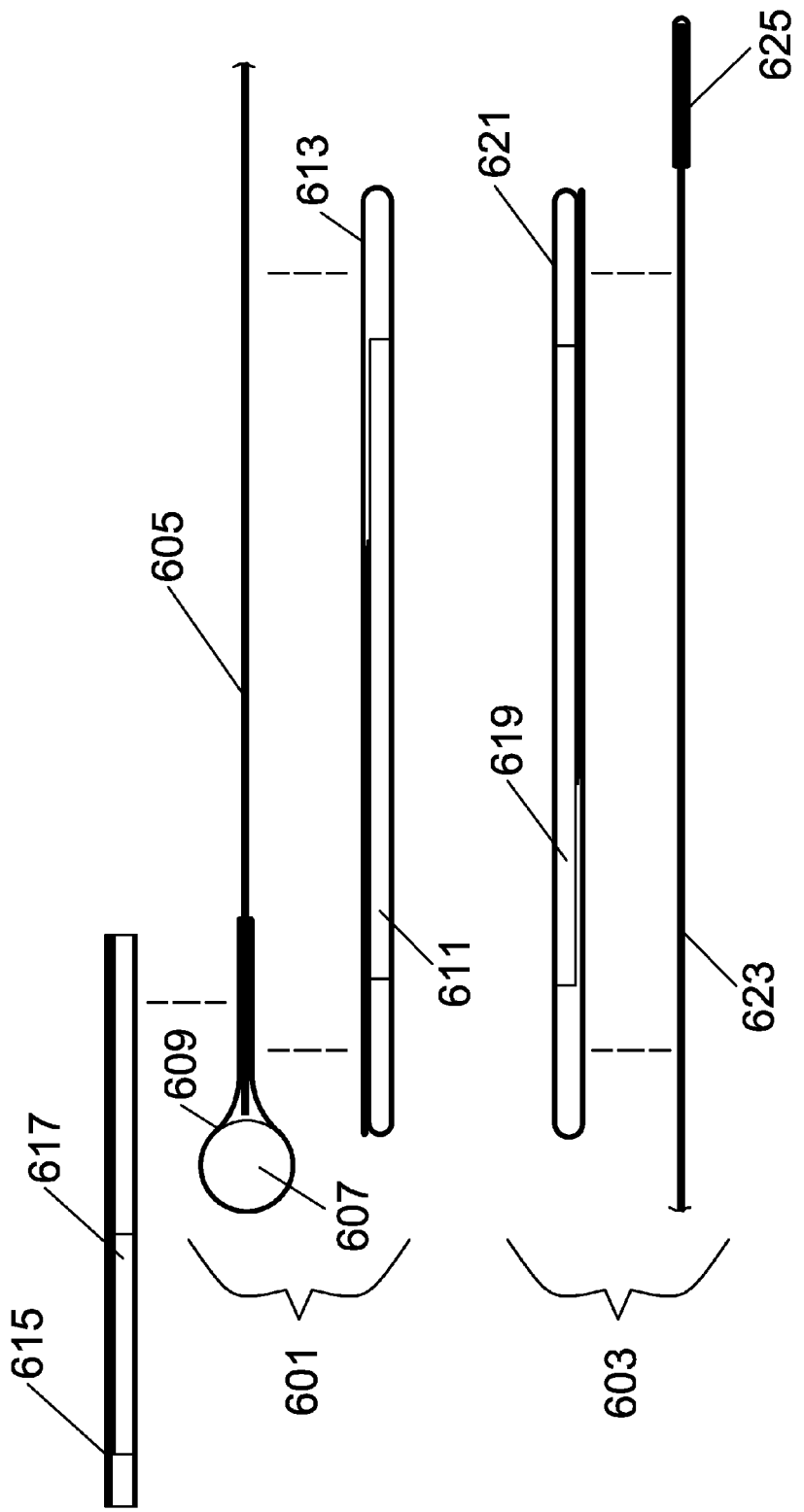
FIG. 6 is an exploded view of the bottom edge of the outer and inner door and seal.

FIG. 6 depicts an exploded view of the bottom edge of the outer and inner door and seal. At the bottom of FIG. 6 is the door closure surface 603 showing fabric 623 with a bias 625. The fabric 623 may be a single layer, or two or more layers. Attached to the fabric 623 is a magnetic strip 619 encased in fabric 621 or otherwise fastened or sewn. Not shown are stitches or other fastening techniques, but the location of stitches for the overall construction of the enclosure and seal will be known and apparent to one skilled in the art after a review of this specification and drawings. Shown in exploded view above the door closure surface is an exploded view of the door profile 601. Fabric 605 is shown that may be a single layer, or two or more layers. Attached to one end of the fabric 605 is a weight strip 607 that travels the length of the bottom edge of the door and is encased in fabric 609 or otherwise fastened or sewn in a manner that allows the weight strip to be securely attached to the bottom edge of the door by way of stitching, adhesives, fasteners, or the like. Attached to the fabric 605 is a magnetic strip 611 encased in fabric 613 or otherwise fastened or sewn. Attached to the bottom edge of the door is a weight or a plurality of weights 617 encased in fabric 615 or otherwise fastened or sewn. The weight and fabric assembly or assemblies are stitched, or otherwise fastened to the bottom edge of the outer door. Various embodiments of the present invention may use different combinations of weights and weight strips or other weighting techniques to properly seal and align the door.

The electromagnetically shielded enclosure and entry seal can be constructed using standard stitching, and may also, in some embodiments, be constructed using adhesives or other fabric fastening techniques known to those skilled in the art. The electromagnetically shielded enclosure may be made from a single layer of fabric, or, in some embodiments of the present invention, may be made from multiple layers of fabric, or a combination thereof. For example, the front (entry side) of the electromagnetically shielded enclosure may be made from a double layer of metallized fabric, while the remainder of the tent may be made from a single layer of metallized fabric. The remainder of the tent may also be made from a double layer of metallized fabric, or further layers. The novel combination of inner door and outer door with their magnetic sealing arrangement thus provides an electromagnetic seal that has heretofore not been possible with electromagnetically shielded enclosures and their associated entry areas.

Figure 7:
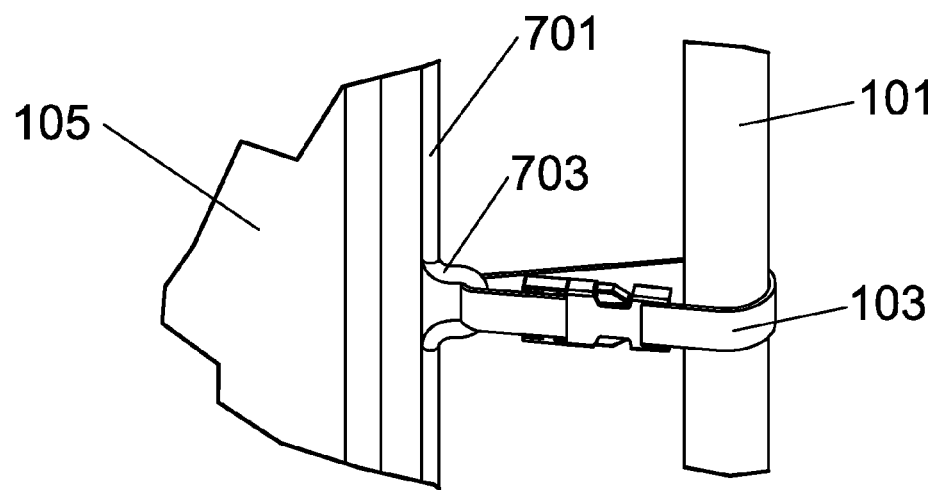
FIG. 7 is a close-up view of the enclosure to frame retention assembly.
Figure 8:
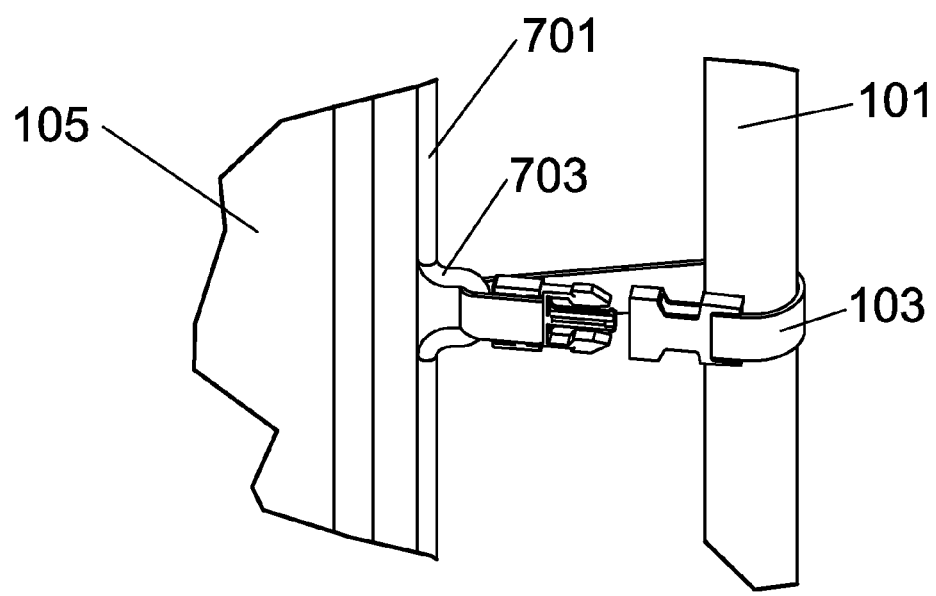
FIG. 8 is a close-up view of the enclosure to frame retention assembly with a quick release buckle in the open position.

Lastly, turning to FIGS. 7 and 8, a close-up view of the enclosure to frame retention assembly with a quick release buckle in the closed and open position respectively, is shown. As previously depicted in FIG. 1 and previously described herein, a side of the enclosure 105 may be stitched in such as way that cord retention 701, such as a pocket or hem, is made for a cord 703 to travel along and be retained to the side 105 (a side may also be a corner where two or more sides come together, or a top or a bottom). The cord 703 may be a rope such as woven polypropylene, nylon, or a metal or synthetic stranded or single strand cord. As can be seen in FIG. 7, the cord 703 protrudes from the cord retention 701 to allow a retaining strap 103 to be placed through the protruding cord and also placed around the frame 101 as shown in FIGS. 7 and 8 and in a way that allows the enclosure to be retained and held up by the frame 101. Should the enclosure be frameless, an internal frame, inflatable, or otherwise not require the frame 101, this enclosure to frame retention assembly may be omitted or modified. This enclosure to frame retention assembly may also be used with portable enclosures that are not RF shielded enclosures.

It is, therefore, apparent that there has been provided, in accordance with the various objects of the present invention, an electromagnetically shielded enclosure and entry seal. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, claims and the attached drawings.

What is claimed is:

1. An electromagnetically shielded enclosure comprising a metalized fabric providing electromagnetic shielding and having an entry seal where the entry seal comprises an outer electromagnetically shielded metalized fabric door having a perimeter magnetic strip encased in fabric, an outer door magnetic closure that aligns with the outer door perimeter magnetic material, an inner electromagnetically shielded metalized fabric door having a perimeter magnetic strip encased in fabric, and an inner door magnetic closure that aligns with the inner door perimeter magnetic material; whereas in use the outer door overlays the inner door and the inner door and the outer door lie in generally parallel planes to each other.

2. The electromagnetically shielded enclosure of claim 1, further comprising an outer door alignment loop.

3. The electromagnetically shielded enclosure of claim 1, further comprising an inner door alignment loop.

4. The electromagnetically shielded enclosure of claim 1, wherein the outer door rolls inwardly.

5. The electromagnetically shielded enclosure of claim 1, wherein the outer door rolls outwardly.

6. The electromagnetically shielded enclosure of claim 1, wherein the inner door rolls inwardly.

7. The electromagnetically shielded enclosure of claim 1, wherein the inner door rolls outwardly.

8. An electromagnetically shielded enclosure comprising a metalized fabric providing electromagnetic shielding and having an entry seal where the entry seal comprises an outer electromagnetically shielded metalized fabric door having a perimeter closure material, an outer door perimeter closure that aligns with the outer door perimeter closure material, an inner electromagnetically shielded metalized fabric door having a perimeter closure material, and an inner door perimeter closure that aligns with the inner door perimeter closure material; whereas in use the outer door overlays the inner door and the inner door and the outer door lie in generally parallel planes to each other.

9. The electromagnetically shielded enclosure of claim 8, wherein the closure material of the inner door and the outer door is conductive hook and loop fastening material.

10. The electromagnetically shielded enclosure of claim 8, wherein the closure material of the inner door and the outer door is a rigid flap.

11. The electromagnetically shielded enclosure of claim 8, wherein the closure material of the inner door and the outer door is a weight strip.

12. The electromagnetically shielded enclosure of claim 8, wherein the closure material of the inner door and the outer door is conductive foam.

13. The electromagnetically shielded enclosure of claim 8, wherein the closure material of the inner door and the outer door is a radiofrequency absorber material.

14. The electromagnetically shielded enclosure of claim 8, wherein the closure material of the inner door and the outer door is a magnetic strip.

15. The electromagnetically shielded enclosure of claim 8, wherein the closure material of the inner door and the outer door is a conductive zipper.

* * * * *